(12) United States Patent
Chung et al.

(10) Patent No.: US 8,574,823 B2
(45) Date of Patent: Nov. 5, 2013

(54) MULTI-LEVEL LAYER

(75) Inventors: Bradley D. Chung, Corvallis, OR (US); Alan T. Davis, Philomath, OR (US); Colin C. Davis, Corvallis, OR (US); Mohammed S. Shaarawi, Corvallis, OR (US); Jeremy H. Donaldson, Philomath, OR (US); Joe E. Stout, Philomath, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 2719 days.

(21) Appl. No.: 11/243,614

(22) Filed: Oct. 5, 2005

(65) Prior Publication Data

US 2007/0077525 A1   Apr. 5, 2007

(51) Int. Cl.
*G03F 7/26* (2006.01)

(52) U.S. Cl.
USPC .......................................... 430/322; 430/330

(58) Field of Classification Search
USPC .............. 430/322, 311, 7, 394, 320, 321, 330
See application file for complete search history.

(56) References Cited

U.S. PATENT DOCUMENTS

| | | | |
|---|---|---|---|
| 4,643,528 A * | 2/1987 | Bell, Jr. .......................... 349/166 |
| 5,024,918 A * | 6/1991 | Porter et al. ................... 430/269 |
| 5,168,383 A | 12/1992 | Iwaki et al. |
| 5,493,429 A | 2/1996 | Kanemoto et al. |
| 5,604,081 A * | 2/1997 | Stoll .............................. 430/322 |
| 5,631,111 A | 5/1997 | Niu et al. |
| 6,368,682 B1 * | 4/2002 | Fong .............................. 428/1.5 |
| 6,693,697 B2 | 2/2004 | Sakamoto et al. |
| 2004/0101782 A1 * | 5/2004 | Gorczyca ...................... 430/290 |
| 2004/0225025 A1 * | 11/2004 | Sullivan et al. ................. 522/71 |
| 2005/0142464 A1 * | 6/2005 | Moriya .............................. 430/7 |

FOREIGN PATENT DOCUMENTS

| | | |
|---|---|---|
| DE | 3842507 | 6/1989 |
| EP | 0 442 738 A | 8/1991 |
| WO | WO 95/17690 A | 6/1995 |
| WO | WO 2005/008321 | 1/2005 |

OTHER PUBLICATIONS

Keiper, B et al, "Microstructuring of Pyrex glass and polymers by excimer laser" Proc. of the SPIE—The Int'l Soc. for Optical Engineering, V. 5116, 2003, pp. 20-27.
Srinivasan, R. "Ablation of polymethyl methacrylate films by pulsed ultraviolet and infrared lasers: A comparatiave study . . . ", Jrnl of Applied Science, V. 73(6), Mar. 15, 1993.
D. W. Johnson, A. Jeffries, D.W. Minsek and R. J. Hurditch, Improving the Process Capability of SU-8, Part II, *MicroChem Corp.*, 1254 Chestnut Street, Newton, MA 02464 (7 pp.), 2001.
M. Shaw, D. Nawrocki, R. Hutditch and D. Johnson, D. W. Johnson, A. Jeffries, D.W. Minsek and R. J. Hurditch, Improving the Process Capability of SU-8, *MicroChem Corp.*, 1254 Chestnut Street, Newton, MA 02464 (9 pp.), 2003.

* cited by examiner

*Primary Examiner* — Brittany Raymond

(57) ABSTRACT

Various methods and apparatus relating to a multi-level layer are disclosed.

25 Claims, 9 Drawing Sheets

MULTI-LEVEL LAYER

BACKGROUND

Applications sometimes require a layer or structure having distinct levels or thicknesses. Existing methods for fabricating such multiple levels require a relatively large number of process steps, increasing fabrication costs and complexity.

DETAILED DESCRIPTION OF EXAMPLE EMBODIMENTS

Figure 1:
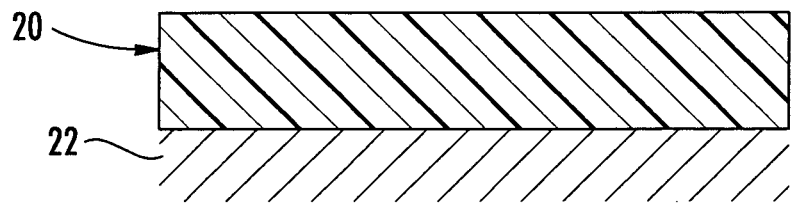
FIGS. 1-4 are side elevational views schematically illustrating one example of a method for forming a multi-level layer according to one example embodiment.
Figure 2:
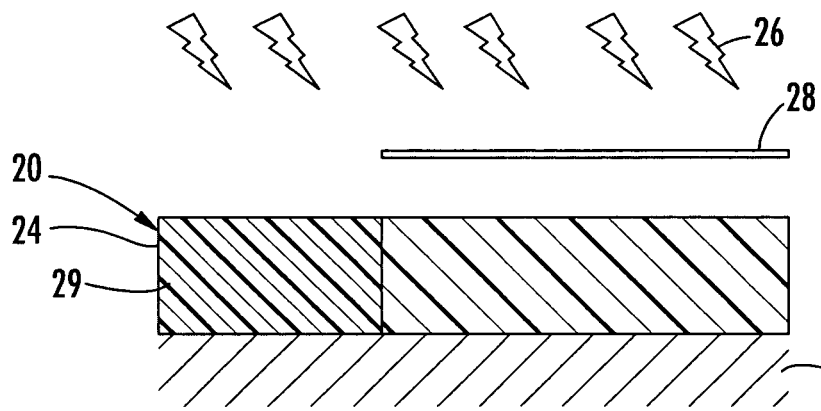
Figure 3:
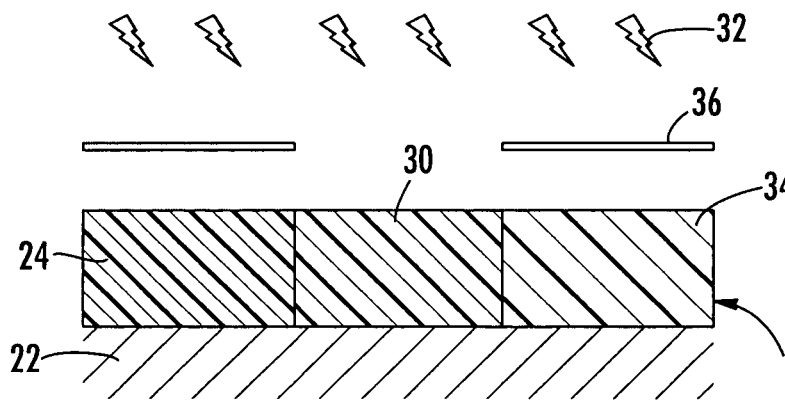
Figure 4:
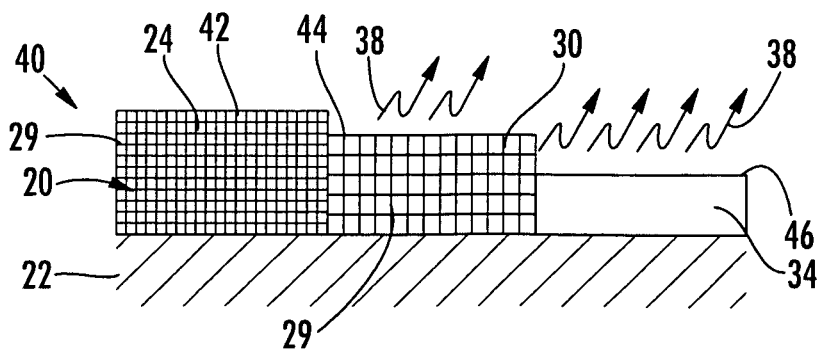

FIGS. 1-4 schematically illustrate one example of a method for forming a multi-level structure or layer 40 (shown in FIG. 4). As shown by FIG. 1, a layer 20 of one or more materials is initially provided. In the particular embodiment illustrated, layer 20 is formed upon substrate 22. In one embodiment, layer 20 is spun upon substrate 22. In other embodiments, layer 20 may be deposited or positioned adjacent to substrate 22 in other fashions.

Substrate 22 may constitute any structure configured to support layer 20. Substrate 22 may be electrically conductive or dielectric. Substrate 22 may be transparent, partially transmissive or opaque.

Layer 20 constitutes one or more layers of one or more materials configured to exhibit a loss or reduction in thickness upon being heated. In one embodiment, layer 20 is formed from materials configured to exhibit a loss or reduction in thickness based at least in part upon exposure of layer 20 to radiation. In one embodiment, layer 20 includes a material configured to exhibit a loss of thickness based at least upon an extent to which layer 20 is heated. In the particular embodiment illustrated, layer 20 includes a material that exhibits a loss of thickness based upon both a degree of exposure of the material to radiation and a subsequent extent of heating of the material.

According to one embodiment, layer 20 includes a material that exhibits a loss of thickness based upon a degree of exposure to ultra-violet radiation. In one embodiment, layer 20 includes a material that exhibits a loss of thickness based at least in part upon heating of the material or layer to a temperature of at least 170 degrees Celsius. In one embodiment, layer 20 includes a material configured to generate various amounts of at least one cross-linking catalyst in response to being exposed to various degrees of radiation, wherein the various amounts of cross-linking catalysts generated results in different degrees of cross-linking during heating such that different percentages of materials in the layer are released, volatized or sublimed during heating.

In one embodiment, layer 20 includes a photo polymer that generates a photo acid in response to being exposed to radiation, such as ultra-violet radiation. In one embodiment, Layer 20 includes a negative photo resist polymer. Layer 20 cross-links in response to being heated. During such heating, one or more volatile reactive molecules (VRMs) are released, volatized or sublimed from the material, resulting in layer 20 exhibiting a loss of thickness. The degree to which the VRMs are released, volatized or sublimed from the remainder of layer 20 may vary depending upon the degree to which the one or more VRMs are bound in the polymeric matrix as a result of the level or degree of cross-linking. In one embodiment, Layer 20 may include a volatile reactive molecule such as a monomer. In one particular embodiment, layer 20 constitutes a layer of a bisphenol-A novolac epoxy resin such as a fully epoxidized bisphenol-A/formaldehyde novolac co-polymer combined with an appropriate photo acid generator (sometimes referred to as SU8).

FIGS. 2 and 3 illustrate selectively exposing portions of layer 20 to distinct exposure doses of radiation. As shown by FIG. 2, a first portion 24 of layer 20 is initially exposed to a first dose 26 of radiation, such as UV radiation, while a remainder of layer 20 remains unexposed to the dose 26 of radiation. In the particular example illustrated, portions of layer 20 are selectively exposed to dose 26 of radiation using a mask 28. Mask 28 is configured to substantially attenuate transmission of dose 26 of radiation. In one embodiment in which the radiation constitutes ultra-violet radiation, mask 28 is configured to substantially attenuate ultra-violet radiation. As a result of being exposed to dose 26, portion 24 of layer 20 generates a cross-linking catalyst such as photo acids 29 (schematically illustrated by hatching). Unexposed portions of layer 20 generate little if any cross-linking catalysts as illustrated and schematically represented by the less dense hatching.

As shown by FIG. 3, portion 30 of layer 20 is exposed to exposure dose 32, while portions 24 and 34 are not substantially exposed to dose 32 of the radiation. As schematically illustrated, dose 32 is relatively less than dose 26. In one embodiment, dose 32 may have a shorter duration. In another embodiment, dose 32 may have a lesser intensity. As a result, portion 30 of layer 20 generates a lesser amount of one or more cross-linking catalysts such as photo acids (as schematically represented by the lesser dense hatching). Portion 34 generates little if any cross-linking catalysts 29 (as schematically represented by the even lesser dense hatching).

In the particular example illustrated, mask 36 is used to substantially attenuate transmission of dose 32 of radiation to portions 24 and 34 while permitting transmission of dose 32 to portion 30. In other embodiments, selective exposure of layer 20 to radiation may be performed in other manners.

As shown by FIG. 4, after selective exposure of portions of layer 20 to radiation, such as ultra-violet radiation, layer 20 is heated. As a result, cross-linking catalyst 29 in portions 24 and 30 (shown in FIG. 3) cause or initiate cross-linking of portions 24 and 30. As further shown by FIG. 4, a different amount of cross-linking catalysts 29 in portions 24 and 30 result in portions 24 and 30 cross-linking to different extents as schematically represented by the denser grid or matrix associated with portion 24 as compared to the lesser dense grid or matrix associated with portion 30. As schematically represented by the lack of a grid or matrix, portion 34 has an even lesser degree or extent of cross-linking as compared to portion 30.

As further shown by FIG. 4, during heating, elements or material 38 are released, volatized or sublimed from portions 30 and 34 to a greater extent as compared to any material that is released, volatized or sublimed from portion 24. As shown by FIG. 4, the material or elements released, volatized or sublimed from portion 34 exceeds that removed from portion 30. As a result, portion 30 has a greater mass loss and reduction in thickness as compared to portion 24. Likewise, portion 34 has a greater percent mass loss and greater reduction in thickness as compared to portion 30. This results in the formation of distinct levels 42, 44 and 46 on portions 24, 30 and 34, respectively.

In one particular embodiment, the material 38 released, volatized or sublimed from portions 30 and 34 constitutes a VRM such as a monomer. In one embodiment in which layer 20 includes SU8, material 38 constitutes bisphenol A diglycidyl ether (BADGE monomer) in the SU8 material of layer 20. In other embodiments, other VRMs, monomers or materials may be released, volatized or sublimed from one or more of portions 24, 30 and 34 to form levels 42, 44 and 46.

The resulting multi-level structure 40 shown in FIG. 4 includes distinct portions 24, 30 and 34. Each of portions 24, 30 and 34 has a distinct level or degree of cross-linking. Each of portions 24, 30 and 34 also has a distinct remaining concentration and molecular weight distribution of a VRM, such as a monomer material, that has not been removed. In particular, each of portions 24, 30 and 34 may have a distinct amount of VRM such as BADGE, remaining after the heating step in FIG. 4. The distinct levels 42, 44 and 46 of structure 40 may serve one of several potential functions in several applications as will be described hereafter.

Figure 5A:
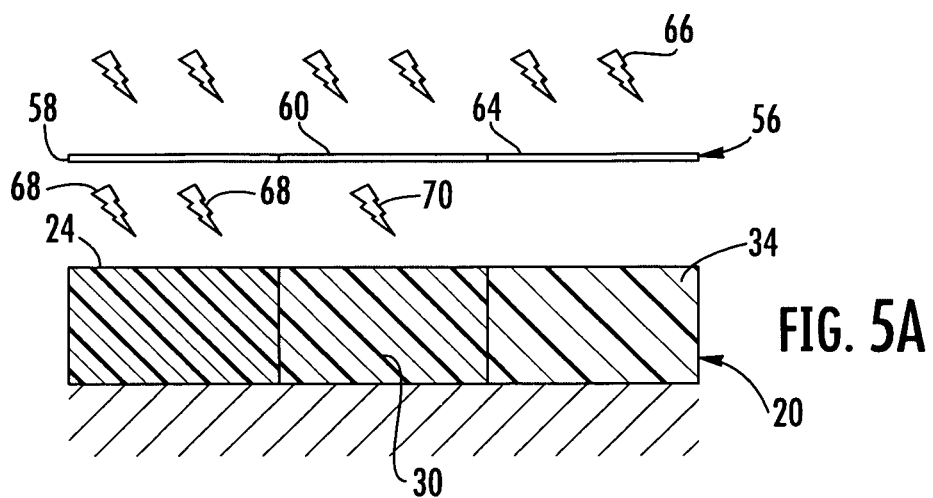
FIG. 5A is a side elevational view schematically illustrating an alternative method for forming the multi-level layer of FIG. 4 according to one example embodiment.
Figure 5B:
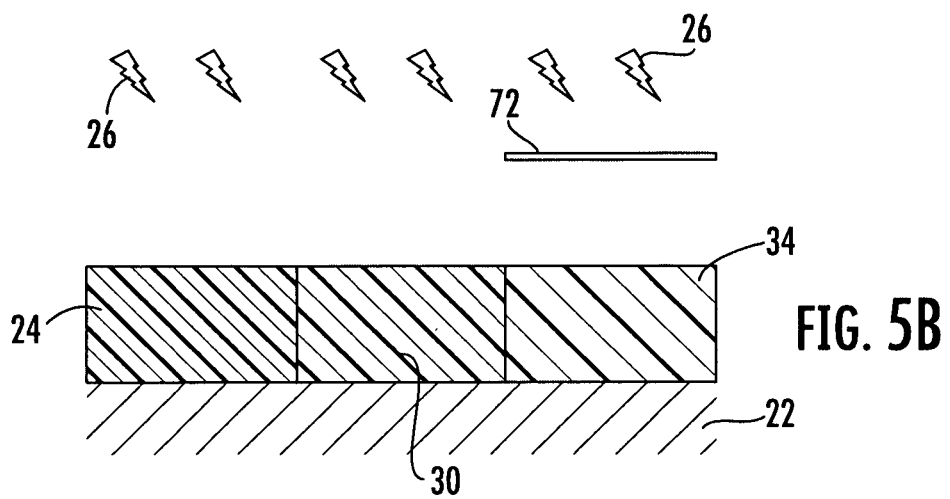
FIG. 5B is a side elevational view schematically illustrating another method for forming the multi-level layer of FIG. 4 according to one example embodiment.

FIGS. 5A and 5B illustrate alternative methods for selectively exposing portions of layer 20 to distinct exposure doses of radiation. FIG. 5A illustrates an alternative method of exposing layer 20 to radiation in lieu of the steps illustrated in steps 2 and 3. As shown in FIG. 5A, in lieu of masks 28 and 36 (shown and described with respect to FIGS. 2 and 3), mask 56 is alternatively used to selectively expose portions of layer 20 to distinct exposure doses of radiation. In particular, mask 56 includes portions 58, 60 and 64 which substantially correspond to the desired size and shape of portions 24, 30 and 34 of layer 20. Portions 58, 60 and 64 of mask 56 have distinct radiation transmissiveness. In the particular example illustrated, portions 58, 60 and 64 are each configured to transmit different intensities of ultra-violet radiation to layer 20. In the example shown, portion 58 is configured to transmit the greatest intensity of UV radiation to portion 24. Portion 60 is configured to transmit a lesser intensity of UV radiation to portion 30. Portion 64 is configured to transmit a level of ultra-violet radiation less than both portions 58 and 60. In one embodiment, mask 56 constitutes a grayscale mask such as a High Energy Beam Sensitive glass mask commercially available from Canyon Materials, Inc., San Diego, Calif.

As shown by FIG. 5A, mask 56 facilitates selective exposure of portions 24, 30 and 34 with a single period of exposure of a single dose 66 which is effectively filtered by mask 56 such that portions 24, 30 and 34 receive distinct exposure doses 68, 70 and substantially no dose, respectively, (as schematically illustrated by bolts 68 and 70). Following the steps shown in FIG. 5A, multi-level structure 40 (shown in FIG. 4) may be formed by heating layer 20 of FIG. 5A.

FIG. 5B schematically illustrates another method of selectively exposing portions of layer 20 to distinct exposure doses of radiation. FIG. 5B schematically illustrates an alternative to the step shown in FIG. 3. In particular, FIG. 5B illustrates selectively exposing portions of layer 20 to distinct exposure doses of radiation by varying the time of exposure that different portions are exposed to radiation such as ultra-violet radiation. As discussed above in FIG. 2, portion 24 of layer 20 is exposed for a first period of time to radiation dose 26 while a remainder of layer 20 has minimal or no exposure. As shown by FIG. 5B, in a subsequent step, portion 24 is once again exposed to dose 26 of ultra-violet radiation. However, portion 30 is also exposed to dose 26 while portion 34 remains unexposed. In the particular example shown, a mask 72 is utilized to expose portions 24 and 30 to radiation while substantially blocking or attenuating transmission of UV radiation to portion 34. In other embodiments, a single mask may be used where the mask is moved or reconfigured. In other embodiments, the dose 26 of radiation applied to portions 24 and 30 in FIG. 5B may alternatively have a distinct intensity or duration as compared to dose 26 that was applied in the step illustrated in FIG. 2.

Because portion 24 is subjected to radiation for a longer total period of time as compared to portions 30 and 34, a larger amount of cross-linking catalysts are generated in portion 24. Likewise, because portion 30 is exposed to a longer duration as compared to portion 34, a greater amount of cross-linking catalysts are generated in portion 30 as compared to portion 34. As discussed above with respect to FIG. 4, the different levels of cross-linking catalysts generated in portions 24, 30 and 34 result in distinct degrees of thickness loss in portions 24, 30 and 34 to form levels 42, 44 and 46 in the finished multi-level layer 40 shown in FIG. 4.

Overall, the process or method shown in FIGS. 1-4, 5A and 5B facilitates fabrication of a single layer of material having multiple distinct levels with fewer individual processing steps and at a lower cost. In particular, the method illustrated in FIGS. 1-4, 5A and 5B forms a multi-level layer 40 (shown in FIG. 4) which utilizes a single coating process (FIG. 1). Because thickness variations are achieved based upon different levels of cross-linking and by volatizing materials from layer 20, developing processes, etching processes and stripping processes may be omitted. In addition, the described process utilizes minimal consumables and may result in minimal process waste disposal. Using grayscale masks, such as mask 56 shown in FIG. 5A, highly repeatable analog changes in thickness may be achieved. In sum, the general method described in FIGS. 1-4, 5A and 5B facilitates low-cost fabrication of multi-level layers or structures.

Figure 6:
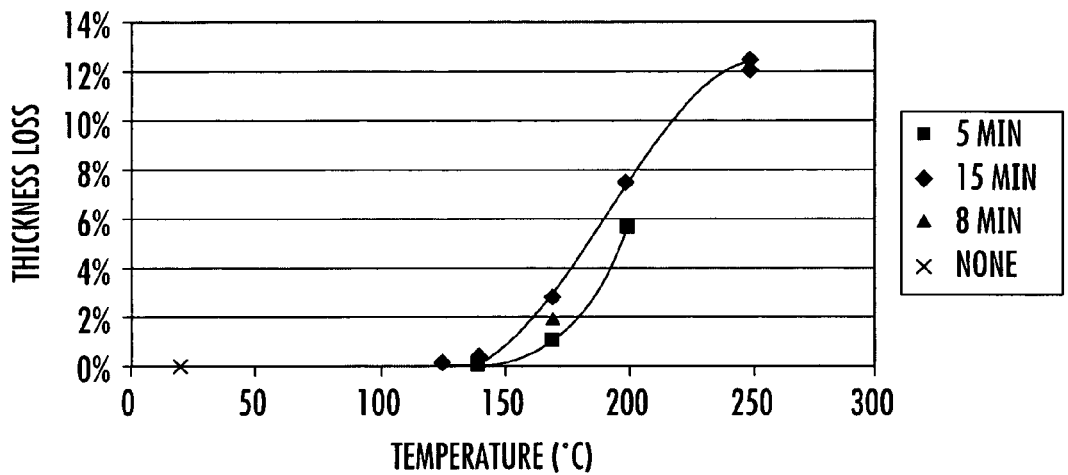
FIG. 6 is a graph illustrating a percent thickness change as a function of different heating according to one example embodiment.

FIG. 6 graphically illustrates thickness loss of a layer of unexposed SU8 as a function of time and temperature at which the layer was heated. As shown by FIG. 6, materials within the SU8 layer, such as a monomer BADGE, begin volatizing, subliming or being released from the layer at a temperature of about 130 degrees. The degree to which such materials are released from the layer to produce changes in thickness of the layer greatly increases when the layer is heated at a temperature of at least about 170 degrees. Heating the unexposed layer of SU8 at 250 degrees for 15 minutes yielded the greatest percent thickness loss of the layer.

Figure 7:
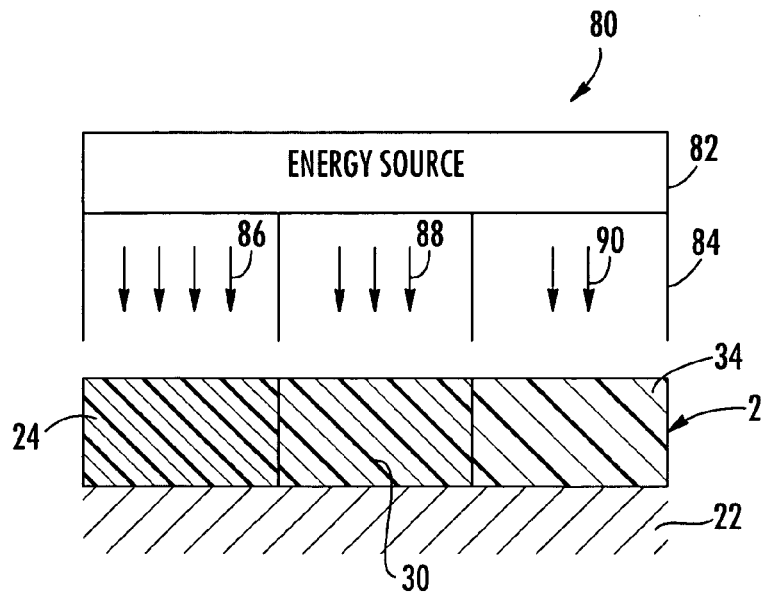
FIG. 7 is a side elevational view schematically illustrating another method for forming a multi-level layer according to one example embodiment.

FIG. 7 schematically illustrates another method for forming multi-level layer 40 shown in FIG. 4. As shown in FIG. 7, in lieu of or in addition to exposing portions 24, 30 and 34 to distinct doses of ultra-violet radiation to form distinct levels 42, 44 and 46 of structure 40 (shown in FIG. 4), portions 24, 30 and 34 may be subjected to different amounts of heating by varying one or both of the time and temperature at which portions 24, 30 and 34 are heated.

In one embodiment, portions 24, 30 and 34 may be subjected to different levels of heating using a heating device 80 which includes an energy source 82 and one or more structures 84 (schematically illustrated) for applying different levels of heat or different levels of energy as schematically represented by arrows 86, 88 and 90 to portions 24, 30 and 34, respectively. In one embodiment, energy source 82 may emit a substantially uniform level of heat across layer 20 while structure 84 constitutes a masking device that thermally insulates portions 24, 30 and 34 to different extents from heat provided by the energy source 82. In another embodiment, energy source 82 may emit distinct levels of heat in distinct zones separated by heat shields and aligned with portions 24, 30 and 34. In still another embodiment, heating device 80 may constitute a laser configured to selectively apply different levels of energy to portions 24, 30 and 34 by varying the intensity of the laser or the duration at which the laser is applied to portions 24, 30 and 34. In one embodiment, the heat may be applied to layer 20 without layer 20 being exposed to ultra-violet radiation. In other embodiments, such selective heating of layer 20 may be performed after layer 20 has been exposed to ultra-violet radiation. In embodiments in which different levels of heat or energy are used to form different levels, an optional final two steps of exposing of layer 20 to an unmasked dose of radiation followed by heating of layer 20 to bind any remaining monomer into place can be performed to substantially eliminate any further monomer evaporation over time.

As shown in FIG. 6 above, subjecting unexposed SU8 to a temperature of 250 degrees for about 15 minutes resulted in a 12 percent loss of overall thickness of the SU8 layer. In particular applications, it may be beneficial to achieve greater percent thickness losses. For example, when multi-level structure 40 (shown in FIG. 4) is to be used in a reflective Fabry-Perot device, at least about 35 percent thickness losses may facilitate emission of light by the device across the full red-green-blue (RGB) spectrum. For transmissive Fabry-Perot devices, percent thicknesses losses in the range of at least about 50 percent facilitate emission of light across the full RGB spectrum.

Figure 8:
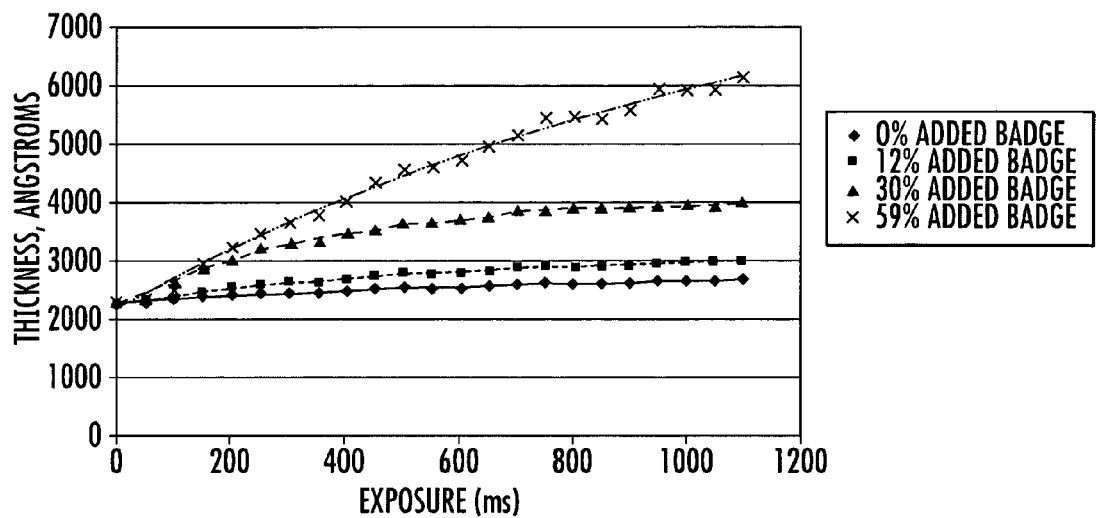
FIG. 8 is a graph illustrating the thickness of layers of material having different levels of a monomer as a function of radiation exposure according to one example embodiment.

FIG. 8 is a graph illustrating various thicknesses of layers of SU8 having different amounts of added monomer, such as BADGE, as a result of being exposed to UV radiation to different extents then being heated at a temperature of at least 250 degrees C. for 2 minutes. In the example shown in FIG. 8, the layers are exposed to UV light having a wavelength of 365 nanometers for different periods of time given in milliseconds (ms). The intensity of the light is such that energy is applied at a rate of 0.5 millijoules per centimeter squared per millisecond. As shown by FIG. 8, for a fixed amount of added monomer, higher exposure levels of SU8 to ultra-violet radiation result in thicker final films after being heated at a temperature of 250 C for at least 2 minutes. In addition, as the amount of BADGE, as a percentage of total solids of the SU8, is increased, the percent difference between the thickness of two different areas subjected to fixed differences of exposure to ultra-violet radiation and subsequently heated at the same temperature for the same duration also increases. In particular, it has been found that the percent thickness loss of SU8 after being exposed and heated may be defined as follows:

$L = Re^{-kd}/(B+R) * 100$ where:

L = percent loss of thickness;
B = a predetermined floor constant;
R = a range constant;
K = a constant; and
D = exposure dose FIG. 9 graphically illustrates percentage thickness loss of a layer of unexposed SU8 as a function of addition of a monomer such as BADGE above the level of BADGE contained in commercially available SU8. The level of BADGE contained in commercially available SU8 is estimated to be between approximately 15-20 percent by mass. In the particular examples illustrated, the layer of SU8 experienced an approximately 18 percent loss of thickness upon being heated as compared to the same heating of the same SU8 that had been exposed to high doses of ultra-violet radiation, where high is defined here as at least about 3000 ms. The 18 percent thickness loss exhibited by the unexposed SU8 of FIG. 8 as compared to the approximately 12 percent thickness loss of the unexposed SU8 of FIG. 6 is believed to be the result of the layer of FIG. 9 being thinner, facilitating greater percentage volatization of BADGE in the layer.

Figure 9:
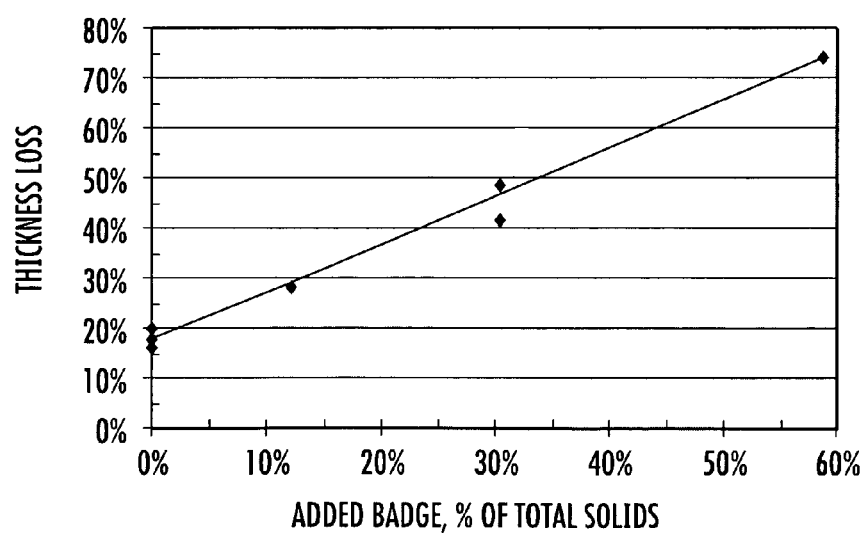
FIG. 9 is a graph illustrating a percent thickness loss of a material as a function of an added monomer according to one example embodiment.

As further shown by FIG. 9, as the percent total solids of BADGE is added to the SU8 layer, the relative percentage thickness loss from portions of the layer that have been exposed to approximately 3,000 ms of ultra-violet radiation as compared to other portions of the same layer of SU8 that remain unexposed increases. As shown by FIG. 9, the rate at which the percent thickness loss increases is a linear function of the percent of total solids of BADGE added to the SU8 material. As shown by FIG. 9, up to over 70 percent thickness loss may be achieved with the addition of BADGE in the amount of approximately 60 percent of the total solids (excluding solvents) of the SU8 layer.

Thus, as shown by FIG. 8, by adding BADGE or other monomers to the negative resist polymer, such as SU8, percent thickness losses may be increased to enhance height differences between levels of a multi-level layer such as layer 40 shown in FIG. 4. In other embodiments, in lieu of adding a VRM, such as BADGE to a commercially available photo polymer such as SU8, materials having appropriate concentrations of VRMs, such as monomers such as BADGE, may be directly formed or synthesized to provide a volatile polymer that has varying degrees of volatization upon being heated to provide distinct thicknesses or levels.

Figure 10:
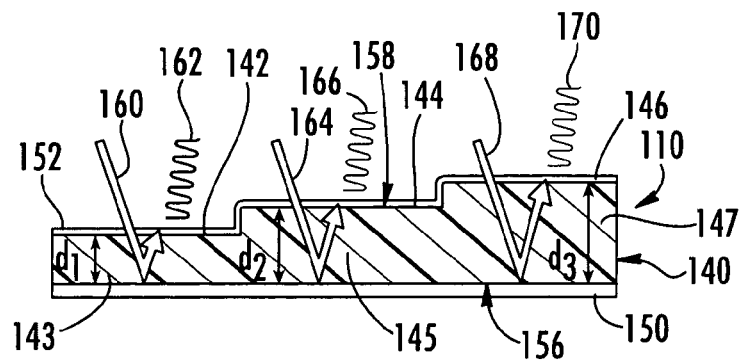
FIG. 10 is a sectional view schematically illustrating one example of a multi-etalon structure according to one example embodiment.

FIGS. 10-15 illustrate various embodiments of multi-etalon Fabry-Perot structures using multi-level layers such as multi-level layer 40 shown in FIG. 4. FIG. 10 is a fragmentary sectional view schematically illustrating multi-etalon structure 110 which includes multi-level layer 140 having levels 142, 144 and 146, full reflector layer 150 and partial reflector layer 152. Multi-level layer 140 constitutes a layer of transparent material providing levels 142, 144 and 146. At least one portion of layer 140 has a thickness of at least about 150 nanometers. Multi-level layer 140 is formed according to the process described above with respect to FIGS. 1-4, 5A and 5B or using the process described above with respect to FIG. 7. In one embodiment, layer 140 is formed from a photo polymer such as a negative resist polymeric material having sufficient concentration of VRMs, such as monomers, layer 140 experiences a sufficient loss of thickness upon being heated as described above with respect to FIGS. 8 and 9. In one embodiment, layer 140 is formed from SU8 in which an appropriate amount of BADGE is added to achieve desired thickness differences between levels 142, 144 and 146. Layer 140 spaces layers 150 and 152 to form optical cavities 143, 145 and 147, respectively, in which light interference occurs such that multi-etalon structure 110 emits colored wavelengths of light.

Levels 142, 144 and 146 have distinct heights relative to side 156 of layer 140 such that layers 150 and 152 are spaced from one another by differing extents. In the particular example illustrated, level 142 is spaced from side 156 by a distance $d_1$, level 144 is spaced from side 156 by a distance $d_2$ and level 146 is spaced from side 156 by a distance $d_3$. In the particular example illustrated, distance $d_1$ is at least about 35 percent less than distance $d_3$, enabling levels 142, 144 and 146 to provide Fabry-Perot optical cavities 143, 145 and 147, respectively, capable of emitting green light, blue light and red light, respectively. In other embodiments, optical cavities 143, 145 and 147 may alternatively be capable of emitting red light, green light and blue light, respectively. In other embodiments, levels 142, 144 and 146 may be spaced from side 156 by differing degrees. Although levels 142, 144 and 146 are illustrated as extending adjacent to one another, levels 142, 144 and 146 may alternatively be spaced from one another. Although level 144 is illustrated as being between levels 142 and 146, in other embodiments, levels 142, 144 and 146 may have other orders or arrangements.

Although multi-level layer 140 is illustrated as including three distinct levels 142, 144 and 146, in other embodiments, layer 140 may include less than all three of such layers for emitting less than the green, blue and red colors. Although layer 140 is illustrated as including three layers, layer 140 may alternatively include greater than three levels, wherein each of such levels are spaced from side 156 differently or wherein two or more levels may be spaced from side 156 by the same distance.

Layer 150 constitutes a layer of one or more materials configured to fully reflect incident light. Layer 150 extends opposite to levels 142, 144 and 146. In one embodiment, layer 150 is deposited upon a first side 156 of multi-level layer 140. In other embodiments, layer 150 may be laminated or otherwise secured to side 156 of multi-level layer 140. According to one embodiment, layer 150 may be formed from silver. In other embodiments, layer 150 may be formed from other materials such as any reflective material.

Layer 152 constitutes a layer deposited upon a second side 158 of multi-level layer 140. Layer 152 extends opposite each of levels 142, 144 and 146. Layer 152 is formed from a partially reflective material which reflects a portion of incident light and which also transmits a portion of incident light towards layer 150. In one embodiment, partial reflector 150 may constitute a layer of silver. In other embodiments, layer 152 may be formed from other partially reflective materials or compositions such as Tantalum.

As shown by FIG. 10, in operation, multi-etalon structure 110 produces a color filter in which incident light reflected from multi-etalon structure 110 has different wavelengths and is colored. In particular, light 160 impinging level 150 is emitted from multi-etalon structure 110 as light 162 having a wavelengths in the red portion of the visible spectrum. Light 164 impinging upon level 144 is emitted from multi-etalon structure 110 as light 166 having a wavelengths in the blue portion of the visible spectrum. Light 168 impinging upon level 146 is emitted from multi-etalon structure 110 as light 170 having wavelengths in the green portion of the visible spectrum.

Figure 11:
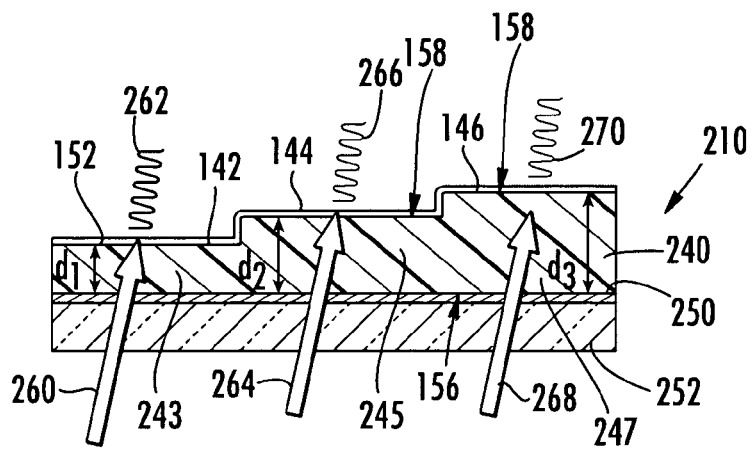
FIG. 11 is a sectional view schematically illustrating another embodiment of the multi-etalon structure of FIG. 10 according to one example embodiment.

FIG. 11 illustrates multi-etalon structure 210, another embodiment of multi-etalon structure 110. Multi-etalon structure 210 is similar to multi-etalon structure 110 except that multi-etalon structure 210 includes multi-level layer 240 and partial reflective layer 250 in lieu of layers 140 and 150, respectively. Multi-level layer 240 is similar to multi-level layer 140 except that level 142 is spaced from side 156 by a distance $d_1$ that is at least about 50 percent less than the distance $d_3$ by which level 146 is spaced from side 156. As a result, levels 142, 144 and 146 may enable multi-etalon structure 210 to emit light across the full visible spectrum including the colors green, blue and red, respectively.

Partial reflective layer 250 constitutes a layer formed from one or more partially reflective materials configured to reflect a portion of impinging light and to also transmit a portion of impinging light. Layer 250 extends opposite to levels 142, 144 and 146 of layer 240. In the particular embodiment illustrated, layer 250 is formed or otherwise provided adjacent to side 156 of layer 240. In one embodiment, layer 250 may be initially formed upon a transparent substrate 252 formed from a material such as glass. In other embodiments, layer 250 may be initially formed upon layer 240. In one embodiment, layer 250 may constitute a layer of a partially reflective material such as silver. In another embodiment, layer 250 may include other partially reflective materials.

In operation, multi-etalon structure 210 serves as a transmissive color filter. As shown by FIG. 11, light 260 from side 156 of layer 240 initially passes through layer 250, through layer 240 and through that portion of layer 152 opposite level 142. Light 262 emitted from level 142 has a wavelength within a red portion of the visible spectrum. Light 264 passes through layer 250, through layer 240 and ultimately through that portion of layer 152 extending opposite level 144 and is emitted as light 266 having a wavelength in a blue portion of the visible spectrum. Light 268 passing through layer 250, through layer 240 and that portion of layer 152 extending opposite level 146 is emitted as light 270 having a wavelength in a green portion of the visible spectrum. In other embodiments, light 260, 264 and 268 may be provided from a source on the other side of layer 240 proximate to side 158. In other embodiments, optical cavities 243, 245 and 247 may alternatively be configured such that emitted light 262, 266 and 270 have wavelengths in the red, blue and green portions of the visible spectrum.

According to one example embodiment, multi-etalon structure 210 may be configured such that layers 152 and 250 each constitute a layer of silver having a thickness of about 25 nanometers while levels 142, 144 and 146, provided by layer 240 formed from SU8, are spaced from side 156 of layer 240 by 147 nanometers, 225 nanometers and 295 nanometers, respectively. In such an example, light 262 has a first order red wavelength while lights 266 and 270 have second order blue and green wavelengths, respectively.

According to yet another embodiment, layers 152 and 250 are formed from silver and have a thickness of about 60 nanometers while layer 240, formed from SU8, provides levels 142, 144 and 146 that are spaced from side 156 by 149, 243 and 303 nanometers, respectively. In this example of multi-etalon structure 210, light 262 constitutes a first order red wavelength while lights 266 and 270 constitute second order blue and second order green colored wavelengths. As compared to the example described above, this particular example of multi-etalon structure 210 has a lower luminosity but a greater gamut.

Figure 12:
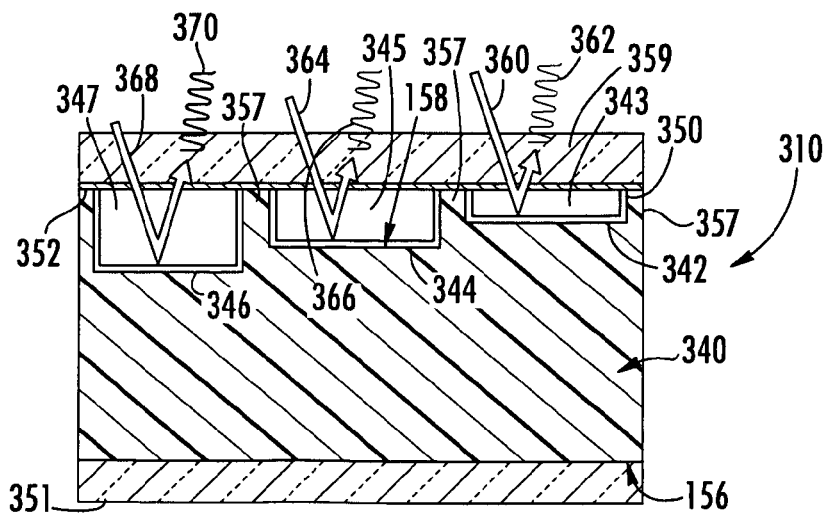
FIG. 12 is a sectional view schematically illustrating another embodiment of the multi-etalon structure of FIG. 10 according to one example embodiment.

FIG. 12 schematically illustrates multi-etalon structure 310, another embodiment of multi-etalon structure 110 shown in FIG. 10. Multi-etalon structure 310 generally includes multi-level layer 340, full reflective layer 350 and partial reflective layer 352. Multi-level layer 340 constitutes a layer of one or more materials formed upon a substrate 351, and having levels 342, 344 and 346 formed utilizing one of the methods shown and described above with respect to FIGS. 1-4, 5A, 5B and 7. In one embodiment, layer 340 may constitute a negative resist polymer. In one embodiment, layer 340 may be transparent. In other embodiment, layer 340 may be opaque or partially opaque. In one embodiment, layer 340 may be formed from SU8.

As shown by FIG. 12, layer 340 is similar to layer 140 in that layer 340 includes multiple levels on side 158 spaced from side 156 by distinct distances. Unlike layer 140, layer 340 additionally includes supports 357 which project beyond levels 342, 344 and 346 to space partial reflective layer 352 from levels 342, 344 and 346. Although layer 340 is illustrated as including four supports 357 with a support 357 on each side of each level 342, 344 and 346, in other embodiments, layer 340 may include a fewer number of such supports for supporting partial reflective layer 352. In still other embodiments, other structures independent of layer 340 may be used to support layer 352 relative to levels 342, 344 and 346.

Levels 342, 344 and 346 are similar to levels 142, 144 and 146. Each level is spaced from partial reflective layer 352 by a distinct distance. In particular, level 342 is spaced from partial reflective layer 352 so as to form an optical cavity 343. Level 344 is spaced from layer 352 to form optical cavity 345. Level 346 is spaced from layer 352 so as to form optical cavity 347. The depth of optical cavity 343 is at least about 35 percent less than the depth of optical cavity 347. As a result, cavity 343, 345 and 347 may emit green, blue and red colored wavelengths of light across nearly the full RGB spectrum.

Layer 350 constitutes a layer of one or more materials configured to fully reflect light. Layer 350 extends opposite to each of layers 342, 344 and 346 as well as opposite to and spaced from layer 352. In one embodiment, layer 350 is deposited upon each of levels 342, 344 and 346. In other embodiments, layer 350 may be formed upon such levels in other manners. In one embodiment, layer 350 constitutes silver. In other embodiments, other materials may be used such as any reflective material.

Because layers 350 and 352 are formed on one side of layer 340, colored light may be emitted without light passing through an entire thickness of layer 340. As a result, layer 340 may be formed from non-transparent material. Moreover, because layers 350 and 352 are on one side of layer 340, layer 340 may be provided with a greater initial thickness. As a result, optical cavities 343, 345 and 347 may be more easily fabricated using the methods described in FIGS. 1-4, 5A, 5B and 7 so as to have sufficient depth differentials (i.e., optical cavities ranging at least from zero to 500 nanometers) for emission of light covering the red-green-blue (RGB) spectrum. In one embodiment, layer 340 may be formed from a negative photo resist polymer without added monomer. For example, in one embodiment, layer 340 may be formed from commercially available SU8 such as NANO SU-8 5, available from MicroChem Corporation, Newton, Mass.

Layer 352 constitutes a layer of one or more partially reflective materials configured to partially transmit incident light and to partially reflect incident light. Layer 352 extends opposite to levels 342, 344 and 346 and is spaced from layer 350. Layer 352 is formed on the same side of layer 340 as layer 350. In one embodiment, layer 352 is laminated to layer 340 upon supports 357 and opposite to levels 342, 344 and 346. In the particular embodiment illustrated, layer 352 is supported by a glass substrate 359 and is laminated to layer 340 opposite to levels 342, 344 and 346. In other embodiments, layer 352 may be secured opposite to levels 342, 344 and 346 in other fashions. In one embodiment, level 352 constitutes Tantalum. In another embodiment, level 352 may constitute other materials such as any partially reflective material.

In operation, white light 360 on side 158 of layer 340 passes through layer 352 and through optical cavity 343 and is reflected off of layer 350 opposite to level 342 such that light 362 having a wavelength in the green portion of the visible spectrum is emitted. Light 364 passes through layer 352 and optical cavity 345 while being reflected from layer 350 across level 344 such that light 366 is emitted having a wavelength in the blue portion of the visible spectrum. Light 368 passes through layer 352 and through optical cavity 347 before being reflected off of layer 350 opposite level 346 before being emitted as light 370 having a wavelength in the blue portion of the visible spectrum. In other embodiments, levels 342, 344 and 346 may alternatively be spaced from partial reflector 352 by distances such that light passing through optical cavity 343 and reflected off of reflective layer 350 is red, light passing through optical cavity 345 and reflected off of reflective layer 350 is green and light passing through optical cavity 347 reflected off of layer 350 is blue.

Figure 13:
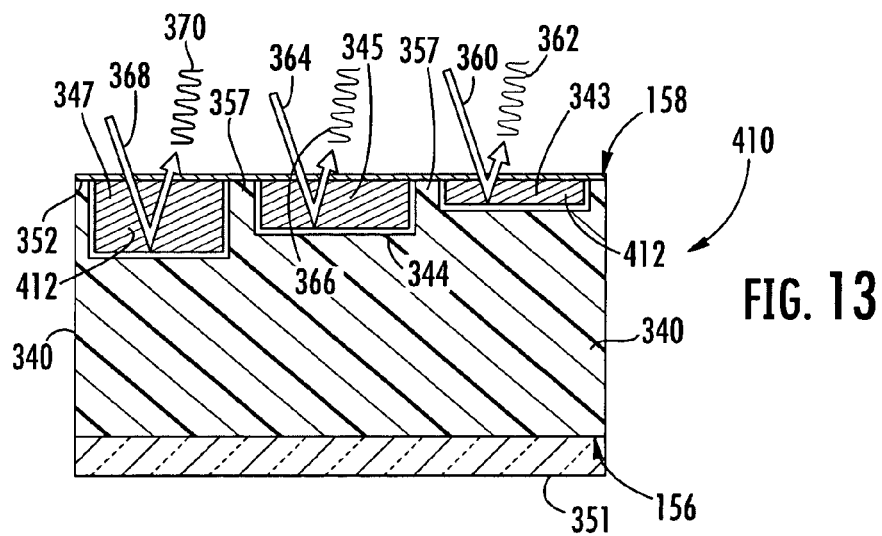
FIG. 13 is a sectional view schematically illustrating another embodiment of the multi-etalon structure of FIG. 10 according to one example embodiment.

FIG. 13 schematically illustrates multi-etalon structure 410, another embodiment of multi-etalon structure 110 shown in FIG. 10. Multi-etalon structure 410 is similar to multi-etalon structure 310 (shown in FIG. 12) except that optical cavities 343, 345 and 347 of multi-etalon structure 410 are filled or coated with a transparent material 412. As a result, in lieu of partial reflective layer 352 being deposited upon a substrate 359 and subsequently being laminated across optical cavities 343, 345 and 347, layer 352 may be directly formed or deposited over ends of posts 357 and over and across material 412. In one embodiment, material 412 is utilized to fill cavities 343, 345 and 347 and a Chemical Mechanical Planarization (CMP) process is used to remove material until a top of layer 340 and material 412 have proper spacing from layer 350. Once the proper spacing or height has been achieved, layer 352 is applied. In one embodiment, layer 412 may constitute SU8. In other embodiments, other transparent materials may be used, such as glass, to fill cavities 343, 345 and 347.

Figure 14:
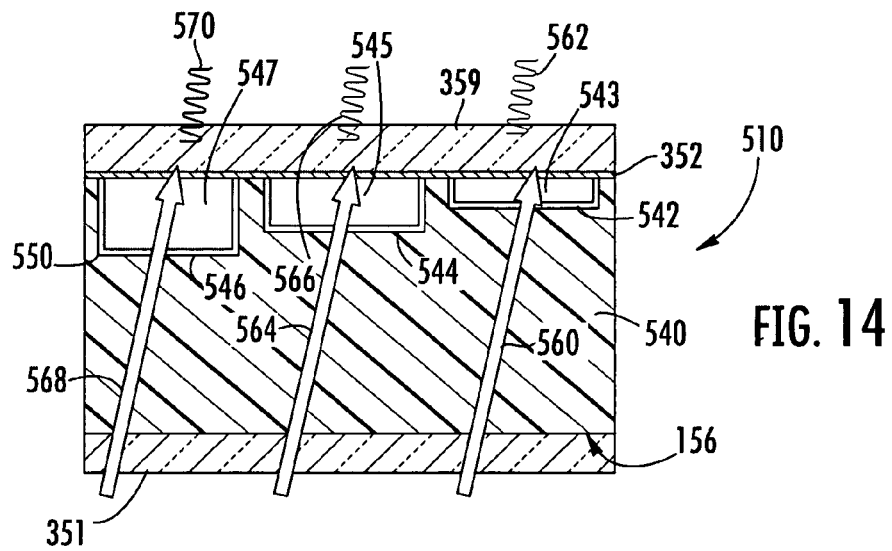
FIG. 14 is a sectional view schematically illustrating another embodiment of the multi-etalon structure of FIG. 10 according to one example embodiment.

FIG. 14 is a sectional view schematically illustrating multi-etalon structure 510, another embodiment of multi-etalon structure 110. Multi-etalon structure 510 is similar to multi-etalon structure 310 except that multi-etalon structure 510 includes multi-level layer 540 and partial reflective layer 550 in lieu of multi-level layer 340 and reflective layer 350, respectively. Those remaining components or elements of multi-etalon structure 510 which correspond to elements of multi-etalon structure 310 are numbered similarly.

Like one embodiment of layer 340, layer 540 is formed from a transparent material. In one particular embodiment, layer 540 is formed from a transparent negative resist polymer. In one particular embodiment, layer 540 is formed from SU8. Like layer 340, layer 540 may be formed from one of the methods described above with respect to FIGS. 1-4, 5A, 5B and 7.

Levels 542, 544 and 546 are similar to levels 342, 344 and 346 except that levels 542, 544 and 546 are relatively deeper to provide optical cavities 543, 545 and 547 with greater depth differentials. In one embodiment, optical cavity 547 has a depth at least 50 percent greater than the depth of optical cavity 543, enabling multi-etalon structure 510 to emit light across a broader portion of the RGB spectrum.

Partial reflective layer 550 constitutes a layer of one or more partially reflective materials configured to transmit a portion of light while also reflecting a portion of incident light. Layer 550 extends opposite to levels 542, 544 and 546 while being spaced from layer 352 by optical cavities 543, 545 and 547. In one embodiment, layer 550 is deposited or formed upon each of levels 542, 544 and 546. In the particular embodiment illustrated, layer 550 may be formed from silver. In other embodiments, layer 550 may be formed from other materials such as any partially reflective material.

Multi-etalon structure 510 serves as a transmissive color filter. In operation, light 560, entering from side 156 of layer 540 passes through the transparent substrate 351, through layer 540, through layer 550, through optical cavity 543 and through layer 352 where it is emitted as light 562 having a wavelength in the green portion of the visible spectrum. Light 564 likewise passes through substrate 351, through layer 540, through layer 550, through optical cavity 545 and through layer 352 where it is emitted as light 566 having a wavelength in the blue portion of the visible spectrum. Light 568 passes through substrate 351, through layer 540, through layer 550, through optical cavity 547 and through layer 352 where it is emitted as light 570 having a wavelength in the red portion of the visible spectrum.

In other embodiments, optical cavities 543, 545 and 547 may alternatively have depths such that light transmitted across such cavities is in the red, green and blue portions of the visible spectrum, respectively. Like multi-etalon structure 310, multi-etalon structure 510 includes multi-level layer 540 having an increased thickness which facilitates greater differentiation between levels 542, 544 and 546 and enabling multi-etalon structure 510 to emit light across a broader portion of the RGB spectrum.

Figure 15:
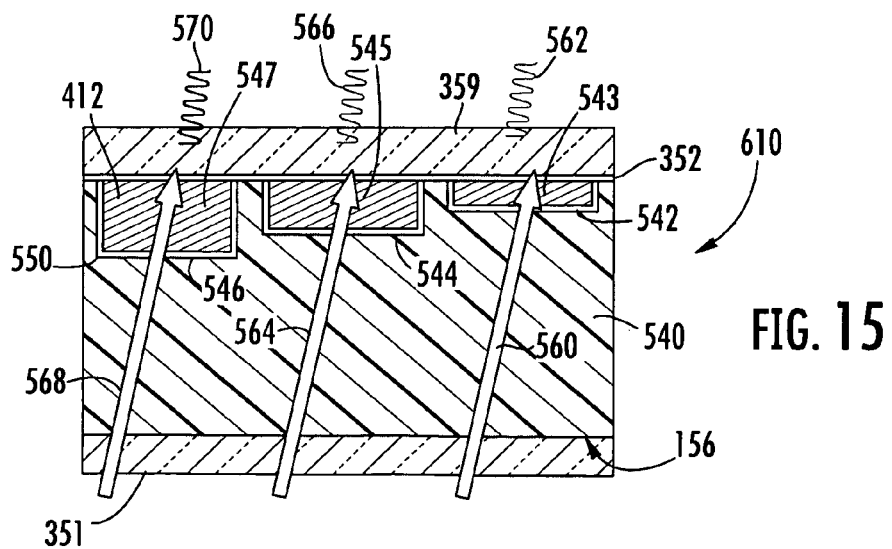
FIG. 15 is a sectional view schematically illustrating another embodiment of the multi-etalon structure of FIG. 10 according to one example embodiment.

FIG. 15 is a sectional view schematically illustrating multi-etalon structure 610, another embodiment of multi-etalon structure 110 shown in FIG. 8. Multi-etalon structure 610 is similar to multi-etalon structure 510 shown in FIG. 12 except that multi-etalon structure 610 includes transparent filler material 412 which fills optical cavities 543, 545 and 547. Those remaining portions of multi-etalon structure 610 which correspond to multi-etalon structure 510 are numbered similarly. Like multi-etalon structure 410 described above with respect to FIG. 13, multi-etalon structure 610 includes fillers 412 which facilitates easier fabrication of multi-etalon structure 610 and potentially greater control over the dimensions of optical cavities 543, 545 and 547.

Figure 16:
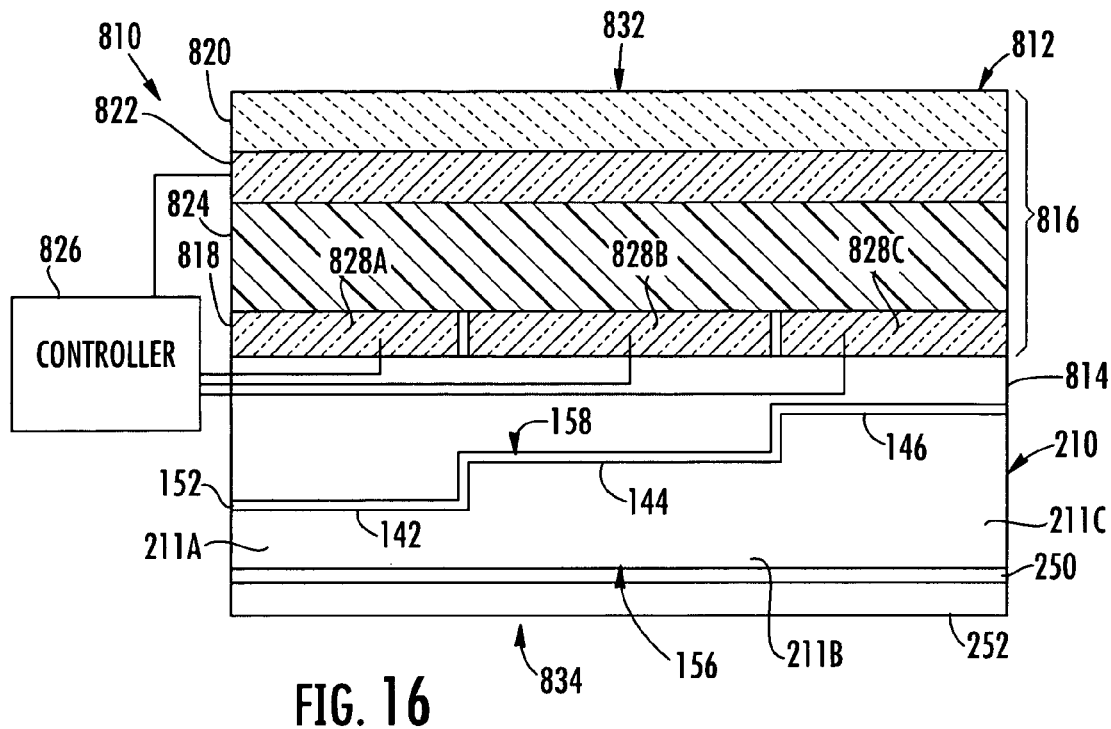
FIG. 16 is a sectional view schematically illustrating a display according to one example embodiment.
Figure 17:
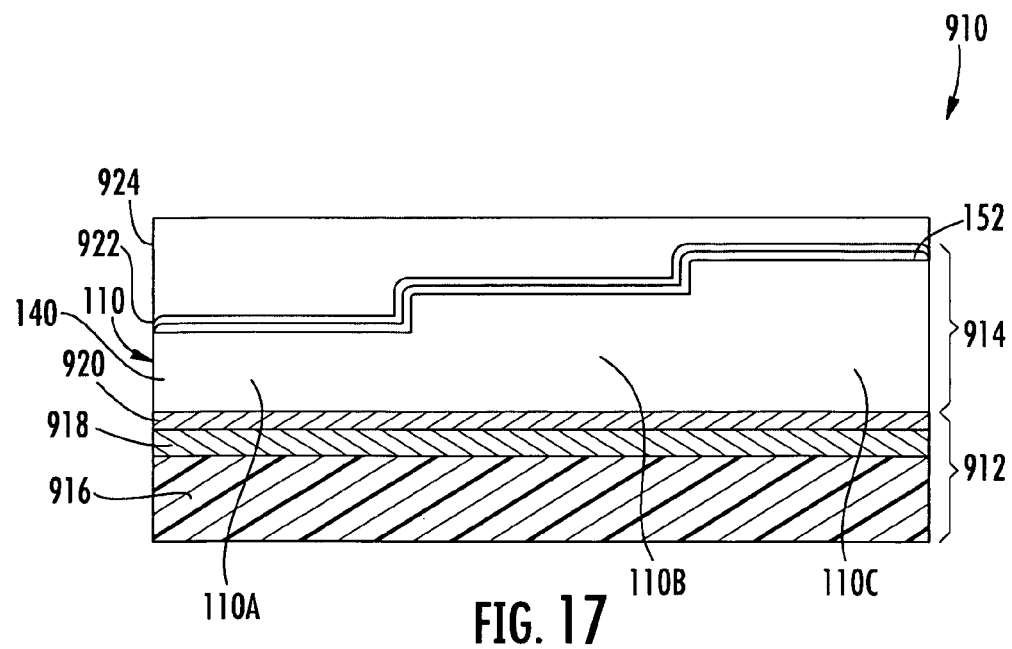
FIG. 17 is a sectional view schematically illustrating an optical disk according to one example embodiment.
Figure 18:
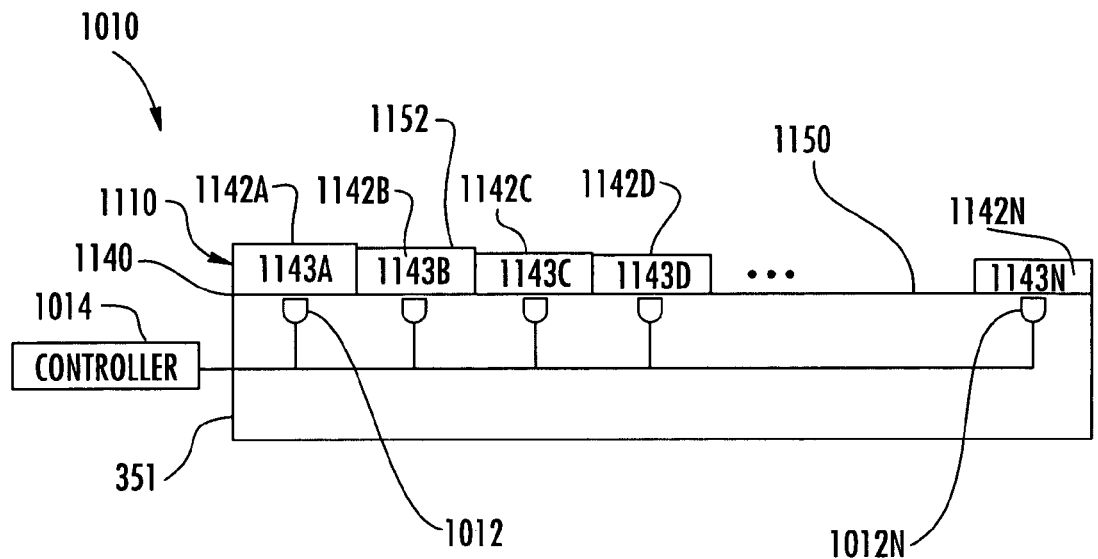
FIG. 18 is a sectional view schematically illustrating one example of a spectrophotometer according to one example embodiment.

FIGS. 16-18 illustrate examples of devices incorporating multi-etalon structures described with respect to FIGS. 10-15 and fabricated according to the method described in FIGS. 1-4, 5A, 5B and 7. FIG. 16 is a sectional view schematically illustrating a display 810 according to one example embodiment. For ease of illustration, FIG. 16 illustrates a single pixel 812 of display 810. According to one example embodiment, display 810 includes a plurality of such pixels 812 positioned generally adjacent to one another. Pixel 812 includes multi-etalon structure 210, intermediate layer 814 and optical shutter 816. Multi-etalon structure 210 is described above with respect to FIG. 11. Multi-etalon structure 210 filters light passing therethrough.

Intermediate layer 814 constitutes a layer of transparent material positioned between multi-etalon structure 210 and optical shutter 816. Layer 814 supports shutter 816 relative to multi-etalon structure 210. In one embodiment, layer 814 may constitute a layer of glass deposited over multi-etalon structure 210. In another embodiment, layer 814 may be formed from one or more other transparent materials. In still other embodiments, layer 814 may be omitted, wherein optical shutter 816 is supported relative to multi-etalon structure 210 in other fashions.

Optical shutter 816 constitutes a device configured to selectively block or attenuate the transmission of light through etalons 211A, 211B and 211C of multi-etalon structure 210. Optical shutter 816 generally includes electrode layer 818, front substrate 820, electrode layer 822, active layer 824 and controller 826. Electrode layer 818 constitutes a layer of electrically conductive material configured to be electrically charged so as to apply an electric field across active layer 824. Electrode layer 818 includes distinct electrically conductive portions or elements 828A, 828B and 828C (collectively referred to as electrode elements 828) configured to selectively apply distinct voltages across active layer 824 to control the translucency of adjacent portions of active layer 824. In the particular embodiment illustrated, electrode elements 828A, 828B and 828C are formed from transparent or translucent electrically conductive materials and overlie etalons 211A, 211B and 211C of multi-etalon structure 210, respectively. For example, in one embodiment, electrode layer 818 may be formed from a conductive material such as indium tin oxide (ITO) or polyethylenedioxythiophene (PEDOT). Each of elements 828 are electrically insulated from one another and are electrically connected to controller 826.

Front substrate 820 constitutes a support structure for electrode layer 822. Front substrate 820 is formed from an optically transparent and clear dielectric material. In one embodiment, front substrate 820 may be formed from an optical clear and flexible dielectric material such as polyethyleneterephthalate (PET). In other embodiments, front substrate 820 may be formed from other transparent dielectric materials that may be inflexible such as glass.

Electrode layer 822 constitutes a layer of transparent or translucent electrically conductive material formed upon substrate 820. Electrode layer 822 is configured to be charged to cooperate with electrode layer 818 to create an electric field across active layer 824. In one embodiment, electrode layer 820 may constitute a transparent conductor such as ITO or PEDOT.

Active layer 824 constitutes a layer of optical charge responsive material configured to change its transparency or reflectivity in response to changes in an applied voltage or charge. In one embodiment, active layer 824 may change from a transparent state, allowing light to pass through active layer 824 and to be filtered through one of etalons 211A, 211B or 211C, to a generally opaque state in which light is absorbed or otherwise attenuated by layer 824. According to one embodiment, active layer 824 may constitute a dichroic dye doped polymer dispersed liquid crystal (PDLC) layer in which pockets of liquid crystal material are dispersed throughout a transparent polymer layer. In other embodiments, active layer 824 may constitute other materials such as electro chromic materials, such as tungsten oxide, or photo chromic or electropheretic materials. In yet other embodiments, active layer 824 may constitute a layer of liquid crystals, such as nematic liquid crystals, wherein display 10 may additionally include polarizing layers on opposite sides of layer 824. In still other embodiments, optical shutter 816 may comprise other presently developed or future developed devices configured to selectively block or attenuate the transmission of light.

Controller 826 constitutes a processing unit configured to generate control signals for selectively charging electrode elements 828 of each pixel 812. For purposes of this disclosure, the term "processing unit" shall mean a presently developed or future developed processing unit that executes sequences of instructions contained in a memory. Execution of the sequences of instructions causes the processing unit to perform steps such as generating control signals. The instructions may be loaded in a random access memory (RAM) for execution by the processing unit from a read only memory (ROM), a mass storage device, or some other persistent storage. In other embodiments, hard wired circuitry may be used in place of or in combination with software instructions to implement the functions described. Controller 826 is not limited to any specific combination of hardware circuitry and software, nor to any particular source for the instructions executed by the processing unit.

In one embodiment, electrode elements 828 of each pixel 812 are electrically connected to a voltage source by an active matrix of electrical switching elements proximate to each of pixels 812. Examples of switching elements include thin film transistors and metal-insulator-metal devices. In other embodiments, a passive array of electrical switching devices may be used to selectively charge electrode elements 828.

In operation, controller 826 generates control signals which cause the electrical switching elements to selectively apply a voltage to one or more of pixel elements 828. As a result, portions of active layer 824 are activated to a transparent or translucent state, permitting light to pass through those portions of active layer 824 and to further pass through corresponding etalons 211. By controlling transmission of light through etalons 211A, 211B and 211C of each pixel 812, controller 810 may form an image.

Although display 810 is illustrated as a transmissive or backlit display, display 810 may alternatively constitute a front lit display. In such an embodiment, layer 250 may alternatively be configured as a reflective layer to reflect light. In one alternative embodiment, display 810 may include a reflective layer proximate to side 832 of device 810. In yet another embodiment, display 810 may include a reflective layer proximate to side 834 of display 810.

Although display 810 is illustrated as incorporating multi-etalon structure 210, in other embodiments, display 810 may alternatively incorporate multi-etalon structure 510 or multi-etalon 610 shown in FIGS. 14 and 15, respectively. In those embodiments in which display 10 constitutes a front lit display, display 10 may alternatively incorporate multi-etalon structures 110, 310 or 410 shown in FIGS. 10, 12 and 13, respectively, wherein such multi-etalon structures provide the reflective layers.

FIG. 17 schematically illustrates optical disk 910 including multi-etalon structure 110 described above with respect to FIG. 10. For ease of illustration, only a small portion of optical disk 910 is shown. Optical disk 910 generally includes data storage portion 912 and label portion 914.

Data storage portion 912 constitutes that portion of optical disk 910 configured to store data. In the particular embodiment illustrated, data storage portion 912 includes support layer 916, light attenuating layer 918 and reflective layer 920. Layer 916 supports light attenuating layer 918 and reflective layer 920. Support layer 916 constitutes one or more layers of one or more transparent materials. In one embodiment, support layer 916 may be formed from polycarbonate. In other embodiments, support 916 may be formed from other transparent materials.

Light attenuating layer 918 constitutes one or more layers of one or more materials configured to change translucency in response to being irradiated by energy such as from a laser.

Reflective layer 920 constitutes one or more layers of one or more materials configured to reflect light. In one embodiment, layer 920 may be formed from aluminum. In another embodiment, layer 920 may be formed from other reflective materials.

In operation, a laser (not shown) is used to selectively irradiate portions of light attenuating layer 918 in a pattern or other manner so as to represent data. Such stored data is later read by directing light, such as with a laser, through those portions of dye layer 918 that remain translucent and sensing light reflected from reflective layer 920. In the particular example described, data storage portion 918 may constitute presently developed or future developed optical disk burning technology such as technology related to CD-recordable disks or CD-Rs.

In other embodiments, in lieu of layer 918 constituting a photosensitive dye, layer 918 may alternatively include a phase change material, enabling layer 918 to change between a translucent state and an opaque or light attenuating state more than one time, allowing memory storage portion 912 to be rewritten upon multiple times. In one particular embodiment, data storage portion 912 may include presently developed or future developed optical disk rewrite technology such as technology related to CD-RWs.

Labeling portion 914 of disk 910 facilitates labeling of disk 910. Labeling portion 914 includes multi-etalon structure 110, light attenuating layer 922 and cover layer 924. Multi-etalon structure 110 is described above with respect to FIG. 16. In other embodiments, labeling portion 914 may alternatively include multi-etalon structure 310 or multi-etalon structure 410 shown in FIGS. 12 and 13, respectively.

Light attenuating layer 922 constitutes one or more layers of one or more materials configured to change between a light translucent state and a dark light-absorbing or light-attenuating state in response to being irradiated by energy such as from a laser. Layer 922 extends opposite to etalons 110A, 110B and 110C. In one particular embodiment, layer 922 is deposited directly upon layer 152 of structure 110. In other embodiments, additional intermediate transparent layers may be provided between layer 152 and layer 922. In one embodiment, layer 922 may constitute presently developed BK-400 or Black 400 commercially available from Nagase America Corporation, New York, N.Y. In other embodiments, dye layer 122 may constitute other materials.

Cover layer 924 constitutes one or more layers or one or more materials that are translucent. Cover layer 924 overlies layer 922 to protect light attenuating layer 922. In one embodiment, cover layer 924 may constitute a translucent material such as acrylic or polycarbonate. In other embodiments, layer 924 may be provided by other light transmissive materials.

In operation, a label may be formed upon label portion 914 by selectively irradiating portions of light attenuating layer 922 to selectively darken portions of layer 922 so as to selectively attenuate transmission of light through selected portions of layer 922. By selectively darkening portions of layer 922 opposite to etalons 110A, 110B and 110C, label portion 914 may be selectively configured to reflect light of different colors in selected patterns or images representing label information that is visually discernable to observers of disk 910.

In the particular example illustrated, reflective layer 920 is utilized by multi-etalon structure 110 in lieu of layer 150, enabling layer 150 to be omitted. In other embodiments, disk 910 may additionally include layer 150 described above with respect to FIG. 10. Although light attenuating layer 922 has been described as being configured to change from a translucent state to a transparent state in response to being irradiated, in other embodiments, layer 922 may alternatively be configured to change from an opaque state to a translucent state upon being irradiated. In still other embodiments, layer 922 may alternatively be configured to change between a translucent state and opaque state more than once, enabling label information to be rewritten more than once upon label portion 914 of optical disk 910.

FIG. 18 schematically illustrates spectrophotometer 1010 including multi-etalon structure 1110, another embodiment of multi-etalon structure 210. In addition to structure 1110, spectrophotometer 1010 includes sensors 1012 and controller 1014. Multi-etalon structure 1110 includes multi-level layer 1140 providing distinct levels 1142A-1142N, partial reflective layer 1150 and partial reflective layer 1152. Multi-level structure 1140 is formed from a transparent material. In one embodiment, multi-level structure 1140 is formed from a transparent negative resist polymer such as SU8. According to one example embodiment, multi-level layer 1140 is formed from one of the methods described above with respect to FIGS. 1-4, 5A, 5B and 7. As a result, levels 1142A-1142N may be formed in fewer processing steps and at a potentially lower cost.

Partial reflective layer 1150 constitutes a layer of one or more partially reflective materials configured to partially reflect incident light and to partially transmit incident light. Layer 1150 extends opposite to the levels 1142A-1142N. Layer 1150 is formed upon or otherwise coupled to substrate 351.

Layer 1152 constitutes one or more layers of partially reflective material extending opposite to levels 1142A-1142N and spaced from layer 1150. In one embodiment, layer 1152 is formed upon levels 1142A-1142N. In one embodiment, layers 1150 and 1152 are formed from silver. In other embodiments, layers 1150 and 1152 may be formed from other materials. Because layer 1152 is formed upon levels 1142A-1142N each of those portions of layer 1152 upon each of levels 1142A-1142N are differently spaced from layer 1150 to form distinct optical cavities 1143A-1143N. As a result of their different thicknesses, optical cavities 1143A-1143N filter different wavelengths of light while transmitting only selected wavelengths of light.

Sensors 1012 constitute individual sensing devices configured to sense reception of light. Sensors 1012 include sensors 1012A-1012N. Each of sensors 1012A-1012N is positioned opposite to a corresponding one of optical cavities 1143A-1143N. Each sensor 1012 is configured to sense reception of light transmitted across optical cavities 1143A-1143N. In one embodiment, sensors 1012 constitute photocells. In other embodiments, sensors 1012 may comprise other devices configured to sense reception of light.

Controller 1014 comprises a processing unit in communication with each of sensors 1012 and configured to analyze signals from sensors 1012 so as to determine a constitution of light impinging multi-etalon structure 1110. In particular, light impinging side 154 of multi-level structure 1110 is filtered by each of etalons formed by layer 1150, layer 1152 and optical cavities 1143A-1143N. Depending upon the constitution of such light, portions of such light will be transmitted across such etalons to one or more of sensors 1012A-1012N. Based upon signals received from sensors 1012A-1012N, controller 1014 determines the constitution of such light, for example, the color of the light.

Figure 19:
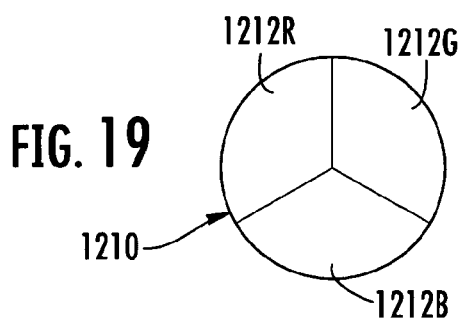
FIG. 19 is a top plan view of one example of a color wheel according to one example embodiment.

FIG. 19 schematically illustrates color wheel 1210 formed according to one of the methods illustrated and described with respect to FIGS. 1-4, 5A, 5B and 7. Color wheel 1210 includes color filter segments 1212R, 1212G and 1212B. Segments 1212R, 1212G and 1212B are configured to filter light such that such segments transmit red, green and blue light, respectively. Color wheel 1210 may be used in various projectors.

In one embodiment, colorwheel 1210 constitutes a multi-etalon structure such as structure 210 shown and described with respect to FIG. 11. Segments 1212R, 1212G and 1212B are formed from a multi-level layer including three distinct levels, wherein the levels correspond to segments 1212R, 1212G and 1212B. The multi-layer structure includes partially reflective layers on opposite sides. As a result of the different levels and the resulting different optical cavities between the partial reflective layers, color wheel 1210 filters light such that incident light upon segments 1212R, 1212G and 1212B of color wheel 1210 is emitted as red, green and blue light, respectively. Because color wheel 1210 is formed from a single multi-level layer, such as layer 240, color wheel 1210 may be easier to manufacture and less expensive.

Figure 20:
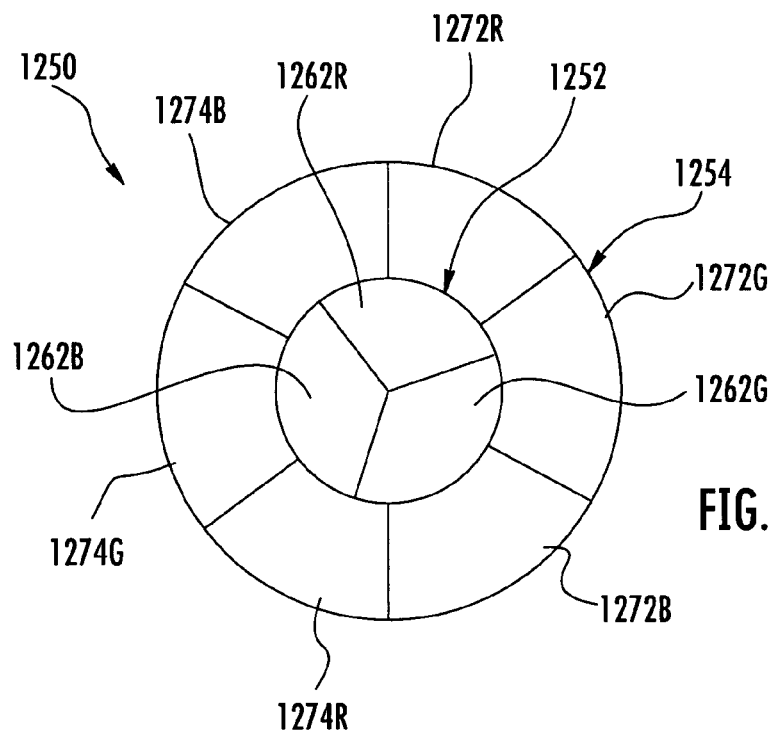
FIG. 20 is a top plan view of another example of a color wheel according to one example embodiment.

Although color wheel 1210 is illustrated as including three segments 1212R, 1212G and 1212B, in other embodiments, color wheel 1210 may include additional segments provided by a multi-level layer including additional levels. For example, in another embodiment, color wheel 1210 may alternatively include four segments provided by four levels and configured to transmit red, green, blue and white light. In yet another embodiment, color wheel 1210 may alternatively include six segments provided by six levels including two red segments, two blue segments and two green segments. FIG. 20 schematically illustrates color wheel 1250 another embodiment of color wheel 1210, that may be formed according to one of the methods illustrated and described above with respect to FIGS. 1-4, 5A, 5B and 7. Color wheel 1250 includes an inner configuration 1252 of color filter segments 1262R, 1262G, and 1262B. Segments 1262R, 1262G, and 1262B are configured to filter light such that such segments transmit red, green and blue light respectively.

Color wheel 1250 additionally includes outer segment 1254 including color filter segments 1272R, 1272G, 1272B, 1274R, 1274G, and 1274B. Segments 1272R, 1274R, segments 1272G, 1274G and segments 1272B, 1274B are configured to filter light such that such segments transmit red, green and blue light respectively.

In one embodiment, color wheel 1250 constitutes a multi-edelon structure, such as structure 210 shown and described with respect to FIG. 11. Segments 1262R, 1262G, 1262B, 1272R, 1272G, 1272B, 1274R, 1274G, and 1274B are formed from a multi-level layer including three distinct levels, wherein the levels correspond to segments 1262R, 1272R, 1274R; 1262G, 1272G, 1274G; and 1262B, 1272B, and 1274B, respectively. The multi-layer structure includes partially reflective layers on opposite sides. As a result of the different levels and the resulting optical cavities between the partial reflective layers, color wheel 1250 filters light such incident light upon such segments is emitted as red, green and blue light.

When employed in a projector, color wheel 1250 provides two distinct color wheel configurations. By displacing color wheel 1250 in a direction perpendicular to a light path, an imagining system of a projector may select either the inner color configuration 1252 or the outer color wheel configuration 1254. Although color wheel 1250 is relatively complex due to its multiple color wheel configurations, because color wheel 1250 may be formed utilizing one of the methods illustrated and described with respect to FIGS. 1-4, 5A, 5B, and 7 color wheel 1250 may be delivered at a lower cost.

Figure 21:
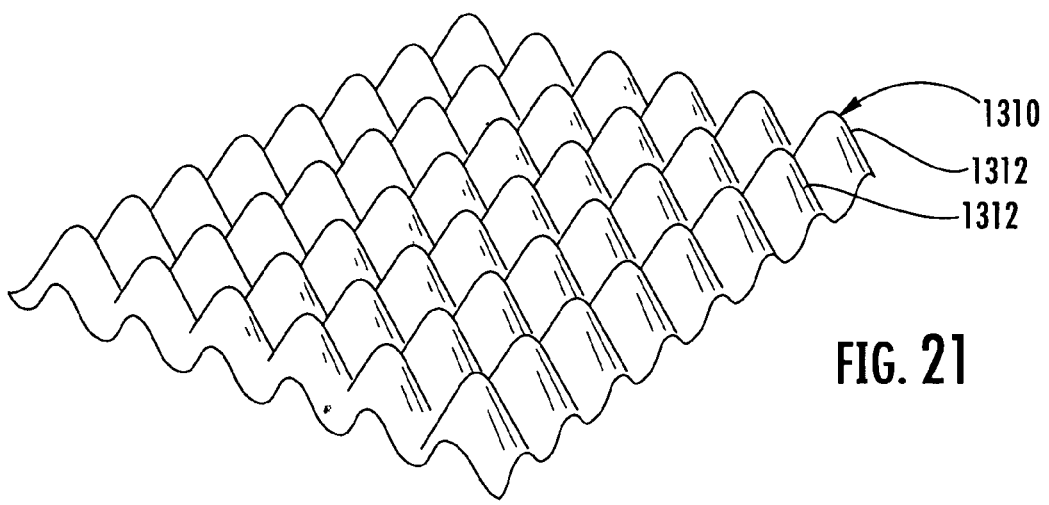
FIG. 21 is a top perspective view schematically illustrating one example of a micro lens according to one example embodiment.

FIG. 21 is a top perspective view illustrating a micro lens array 1310 formed according to one of the methods illustrated and described with respect to FIGS. 1-4, 5A, 5B and 7. In the embodiment illustrated, micro lens array 1310 constitutes a 2-dimensional array of peaks or islands 1312 of transparent material, wherein each peak 1312 constitutes an individual micro lens. In other embodiments, each island 1312 may alternatively be configured as another type of lens.

According to one example embodiment, micro lens array 1310 is formed by providing a layer of transparent negative resist polymeric material, such as SU8, and by selectively exposing the layer to ultra-violet radiation to cause various generation levels of cross-linking catalysts such as photo acids. In one embodiment, the layer is selectively exposed to UV radiation using a mask and stepper defocusing, such as a 25 micrometer focus offset, to achieve an appropriate shape of each of islands 1312 serving as an individual micro lens. Upon completion of the selective exposure of the layer, the layer is subjected to heating at a sufficient temperature and for a sufficient duration such that the exposed portions of the layer undergo cross-linking to varying degrees depending upon the degree of exposure and such that monomers, such as BADGE, within the layer are sublimed or volatized to varying extents from the layer depending upon the degree of cross-linking as described above with respect to FIG. 4. As a result, multiple individual micro lenses may be formed with an integrated process providing tight registration of such individual lenses without assembly.

Although the present disclosure has been described with reference to example embodiments, workers skilled in the art will recognize that changes may be made in form and detail without departing from the spirit and scope of the claimed subject matter. For example, although different example embodiments may have been described as including one or more features providing one or more benefits, it is contemplated that the described features may be interchanged with one another or alternatively be combined with one another in the described example embodiments or in other alternative embodiments. Because the technology of the present disclosure is relatively complex, not all changes in the technology are foreseeable. The present disclosure described with reference to the example embodiments and set forth in the following claims is manifestly intended to be as broad as possible. For example, unless specifically otherwise noted, the claims reciting a single particular element also encompass a plurality of such particular elements.

What is claimed is:

1. A method comprising:
   providing a first layer of material, wherein the first layer is transparent;
   selectively treating portions of the first layer such that differently treated portions exhibit different degrees of material volatilization from the first layer to form different levels, wherein portions of the first layer include at least 20 percent by solids of bisphenol A diglycidyl ether (BADGE) and wherein other portions of the first layer include less than or equal to about 5 percent by solids of bisphenol A diglycidyl ether (BADGE);
   providing a second layer of a partially transparent reflective material adjacent the first layer; and
   providing a third layer of a partially transparent reflective material or a reflective material opposite the second layer of a partially transparent reflective material and spaced from the second layer of a partially transparent reflective material.

2. The method of claim 1, wherein the material comprises a photo polymer.

3. The method of claim 1, wherein the material comprises bisphenol A epoxy resin.

4. The method of claim 3, wherein the material includes at least 20 percent total solids of bisphenol A diglycidyl ether (BADGE).

5. The method of claim 1, wherein the first layer is heated so as to volatilize a portion of the first layer.

6. The method of claim 5, wherein the portion of the first layer comprises a volatile reactive molecule.

7. The method of claim 6, wherein volatile reactive molecule comprises a monomer.

8. The method of claim 1, wherein selectively treating includes differently heating the portions of the first layer.

9. The method of claim 1, wherein selectively treating comprises:
   exposing the portions of the first layer to distinct exposure doses of radiation; and
   heating the portions.

10. The method of claim 9, wherein the radiation comprises ultra-violet radiation.

11. The method of claim 9, wherein selectively exposing portions of the first layer comprises masking portions of the first layer from a source of the radiation with either a mask that substantially attenuates the transmission of the radiation and is selectively positioned opposite the portions or with a mask that differently transmits the radiation to the portions of the first layer.

12. The method of claim 1, wherein the third layer of a partially transparent reflective material or a reflective material is spaced from the second layer of a partially transparent reflective material by a gas.

13. The method of claim 1, wherein the portions of the first layer have different depths and wherein the method further comprises:
   filling the depths with a transparent filler material; and
   providing the third layer of a partially transparent reflective material or a reflective material over the filler material.

14. The method of claim 13, wherein the transparent filler material comprises a transparent solid.

15. The method of claim 14, wherein the transparent solid comprises glass.

16. The method of claim 14, wherein the transparent solid comprises a fully epoxidized bisphenol-A/formaldehyde novolac co-polymer combined with a photo acid generator.

17. The method of claim 1, wherein two of the portions have a height difference of at least about 35 percent of a thickness of the first layer.

18. The method of claim 1, wherein two of the portions have a height difference of at least about 50% of a thickness of the first layer.

19. A method comprising:
   providing a first layer of material;
   selectively treating portions of the first layer such that differently treated portions exhibit different degrees of material volatization from the first layer to form different levels;
   providing a second layer of a partially transparent reflective material on a first side of the first layer; and
   providing a third layer of a partially transparent reflective material or a reflective material opposite the second layer of a partially transparent reflective material on a second side of the first layer.

20. A method comprising:
provided a first layer of material;
selectively treating portions of the first layer such that differently treated portions exhibit different degrees of material volatization from the first layer to form different levels;
providing a second layer of a partially transparent reflective material adjacent the first layer; and
providing a third layer of a partially transparent reflective material or a reflective material opposite the second layer of a partially transparent reflective material and spaced from the second layer of a partially transparent reflective material.

21. The method of claim 20, wherein the third layer of a partially transparent reflective material or a reflective material is spaced from the second layer of a partially transparent reflective material by a gas.

22. The method of claim 20, wherein the portions of the first layer have different depths and wherein the method further comprises:
filling the depths with a transparent filler material; and
providing the third layer of a partially transparent reflective material or a reflective material over the filler material.

23. The method of claim 22, wherein the transparent filler material comprises a transparent solid.

24. The method of claim 23, wherein the transparent solid comprises glass.

25. The method of claim 23, wherein the transparent solid comprises a fully epoxidized bisphenol-A/formaldehyde novolac co-polymer combined with a photo acid generator.

* * * * *

UNITED STATES PATENT AND TRADEMARK OFFICE
CERTIFICATE OF CORRECTION

| | | |
|---|---|---|
| PATENT NO. | : 8,574,823 B2 | Page 1 of 1 |
| APPLICATION NO. | : 11/243614 | |
| DATED | : November 5, 2013 | |
| INVENTOR(S) | : Bradley D. Chung et al. | |

It is certified that error appears in the above-identified patent and that said Letters Patent is hereby corrected as shown below:

In the Claims:

In column 18, line 62, in Claim 19, delete "volatization" and insert -- volatilization --, therefor.

In column 19, line 7, in Claim 20, delete "volatization" and insert -- volatilization --, therefor.

Signed and Sealed this
Thirteenth Day of May, 2014

Michelle K. Lee
*Deputy Director of the United States Patent and Trademark Office*